United States Patent [19]
Assadian et al.

[11] Patent Number: 5,969,545
[45] Date of Patent: Oct. 19, 1999

[54] PEAK DETECTOR CIRCUIT

[75] Inventors: Kamran Assadian, Wheeling; Jeannie H. Kosiec, Schaumburg, both of Ill.

[73] Assignee: Motorola, Inc., Schaumburg, Ill.

[21] Appl. No.: 09/012,745

[22] Filed: Jan. 23, 1998

[51] Int. Cl.[6] .................................................. G01R 19/00
[52] U.S. Cl. ................................................ 327/62; 327/58
[58] Field of Search ................................. 327/58–62, 65, 327/74, 75, 76, 77, 89, 88; 323/315

[56] References Cited

U.S. PATENT DOCUMENTS

| | | | |
|---|---|---|---|
| 4,308,497 | 12/1981 | Rodgers | 327/58 |
| 4,471,292 | 9/1984 | Schenck et al. | 323/315 |
| 5,353,028 | 10/1994 | Wit et al. | 323/315 |
| 5,489,872 | 2/1996 | Gopinathan | 327/65 |
| 5,640,681 | 6/1997 | Barrett, Jr. et al. | 323/315 |
| 5,721,507 | 2/1998 | Fujii et al. | 327/65 |
| 5,798,665 | 8/1998 | Ichihara | 327/62 |

OTHER PUBLICATIONS

Pan, Tzu–Wang et al., "A Wide–Band CMOS Read Amplifier for Magnetic Data Storage Systems", *IEEE Journal of Solid–State Circuits,* vol. 27, No. 6, Jun. 1992, pp. 863–873.
Steyaert, Michael S. et al., "A CMOS Rectifier–Integrator for Amplitude Detection in Hard Disk Servo Loops", *IEEE Journal of Solid–State Circuits,* vol. 30, No. 7, Jul. 1995, pp. 743–751.

*Primary Examiner*—Toan Tran
*Attorney, Agent, or Firm*—Brian M. Mancini

[57] ABSTRACT

A peak detector circuit (100) includes an output transconductance amplifier (102), a current rectifier (104) and an averaging circuit (108). The current rectifier includes an amplifier (115) which reduces input impedance of the current rectifier to increase the operating frequency of the peak detector circuit. An isolator (106) employs a current mirror (509) with a cascode transistor (512) having a bias potential which is dynamically adjusted to achieve accurate mirroring. An amplifier of a common mode feedback circuit (110) has improved linearity.

11 Claims, 3 Drawing Sheets

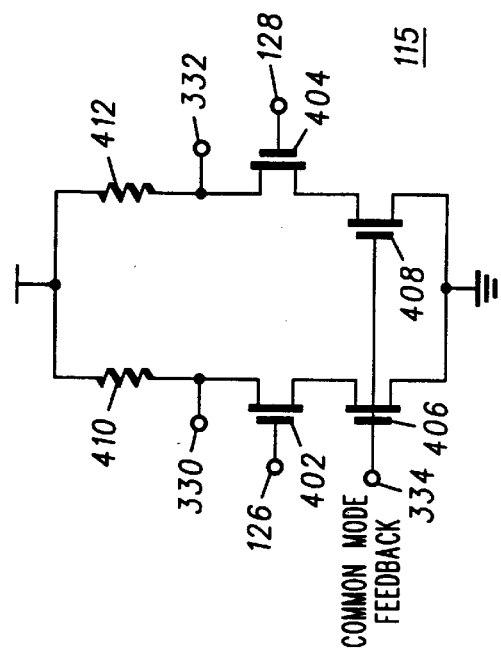
FIG. 2
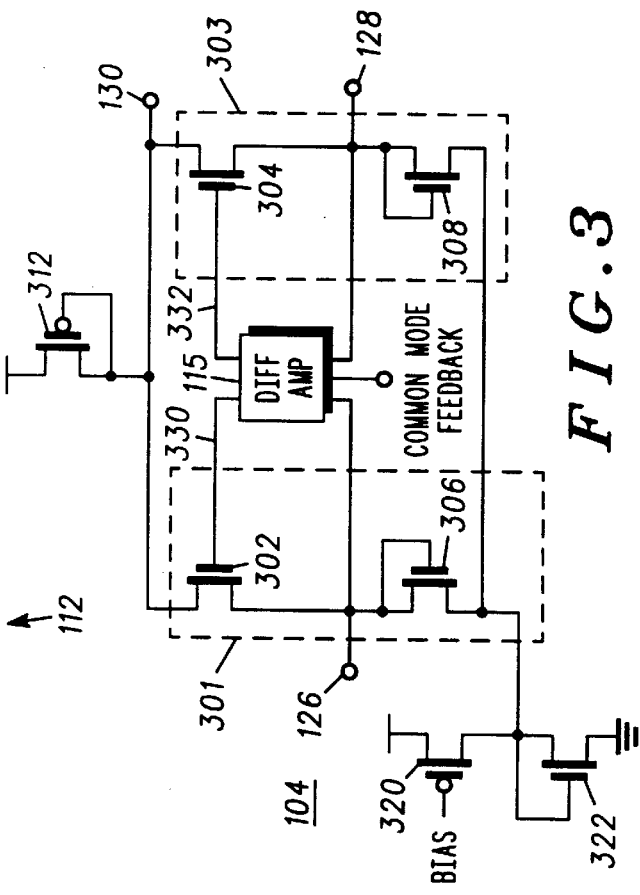
FIG. 4
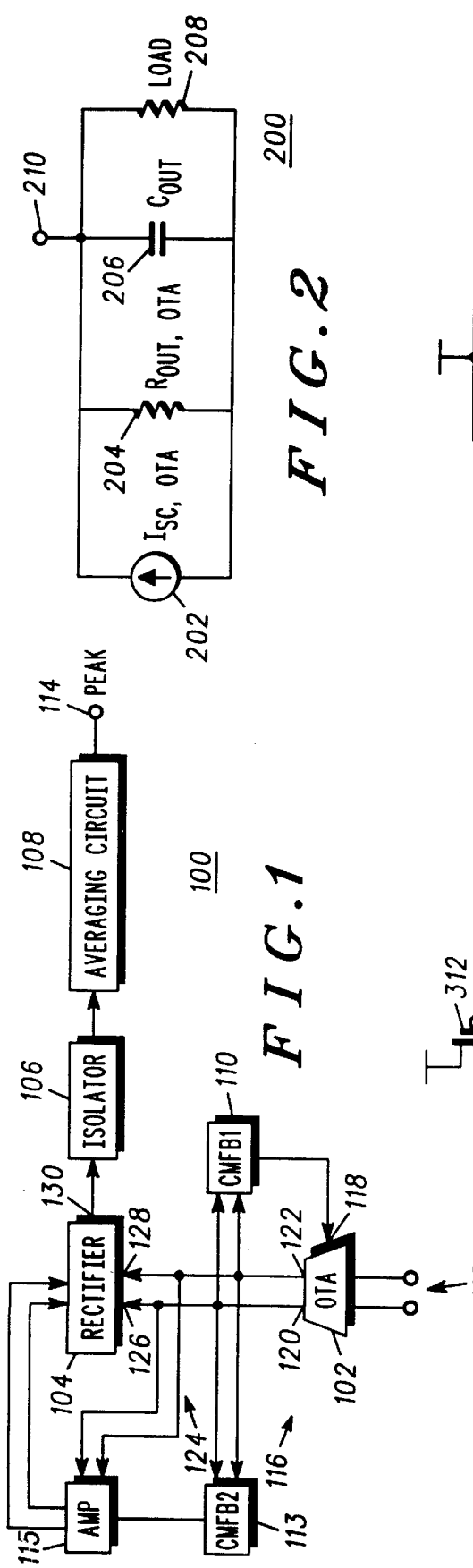
FIG. 1
FIG. 3

PEAK DETECTOR CIRCUIT

FIELD OF THE INVENTION

The present invention generally relates to peak detector circuits. More particularly, the present invention relates to peak detector circuits capable of reliable operation at high frequencies.

BACKGROUND OF THE INVENTION

Peak detector circuits have a variety of applications, including in cellular telephones. In general, a peak detector operates by detecting a time varying input voltage and storing charge on a capacitor to produce a voltage equal to the maximum detected input voltage. Another known type of peak detector converts input voltage to a current and integrates the current. This second type of peak detector may be implemented in complementary metal oxide semiconductor (CMOS) technology, which enhances its applicability. For example, the CMOS peak detector may be integrated on a single integrated circuit with other circuit elements to reduce the cost and size of the overall circuit. Also, the CMOS peak detector may be operated at relatively low operating voltages, such as 3.0 V.

However, known CMOS peak detector designs have been limited to relatively low speed or low frequency applications. In one known design, the maximum input frequency is only 12 MHz, which is too low for many applications.

Accordingly, there is a need in the art for an improved peak detector circuit operable at input frequencies above 12 MHz.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

FIG. 1 is a block diagram of a peak detector circuit in accordance with the present invention;

FIG. 2 is a circuit model of a portion of the peak detector circuit of FIG. 1;

FIG. 3 is a circuit diagram of a current rectifier for use in the peak detector circuit of FIG. 1;

FIG. 4 is a circuit diagram of a differential amplifier for use in the current rectifier of FIG. 3;

DETAILED DESCRIPTION OF A PREFERRED EMBODIMENT

Figure 5:
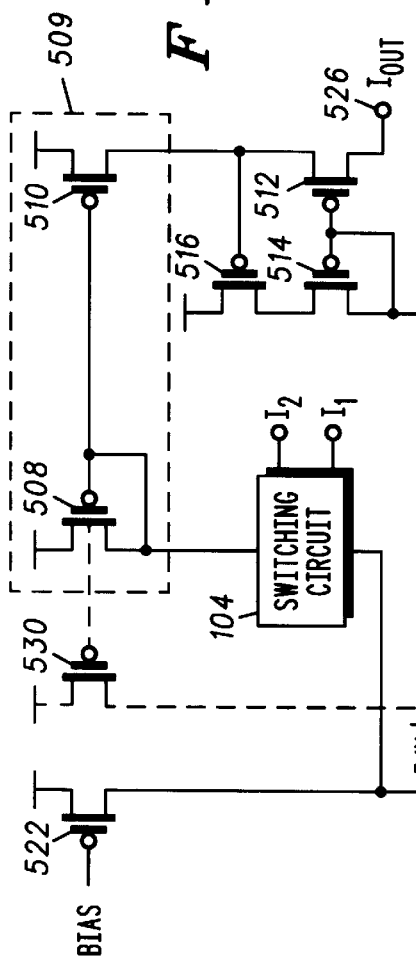
FIG. 5 is a circuit diagram of an isolator for use in the peak detector circuit of FIG. 1.

Referring now to FIG. 1, it shows a block diagram of a peak detector circuit 100 in accordance with the present invention. The peak detector circuit 100 includes an operational transconductance amplifier (OTA) 102, a current rectifier 104, an isolator 106 and an averaging circuit 108. The peak detector circuit 100 further includes a first common mode feedback circuit 110, a second common mode feedback circuit 113 and an amplifier 115. In operation, the peak detector circuit receives an input voltage and produces an output signal having signal values indicative of peak values of the input voltage.

The OTA 102 has an input 112 for receiving the input voltage, an output 116 and a feedback input 118. An operational transconductance amplifier (OTA) is a circuit that produces an output current proportional to a differential input voltage. The ratio of the output current to the input voltage is the transconductance, $g_m$, of the amplifier. The OTA 102 produces an OTA output signal including an output current at the output 116 in response to the input voltage and a feedback signal received at the feedback input 118. The output current is a time varying, generally alternating current (AC) current and may include a direct current (DC) component. In the illustrated embodiment, the output 116 of OTA 102 is a differential output. The output 116 includes a first output 120 and a second output 122. That is, currents of substantially equal amplitude and opposite phase are provided at the first output 120 and the second output 122.

The current rectifier 104 has an input 124 including first input 126 and second input 128 coupled to the OTA and an output 130. The current rectifier 104 produces a signal at the output 130 in response to the output current from the OTA. The current rectifier 104 in the illustrated embodiment full wave rectifies the input current to produce the signal at the output 130. Thus, the current rectifier 104 operates as an integrator, integrating the current received from the OTA 102. In accordance with the present invention, the current rectifier 104 includes an amplifier which decreases input impedance of the current rectifier 104 to increase operating frequency of the peak detector circuit. Detailed structure and operation of the current rectifier 104 will be described below in conjunction with FIG. 3.

The isolator 106 is coupled between the current rectifier 104 and the averaging circuit 108. The isolator 106 operates to buffer the output 130 of the current rectifier 104 from loading by the averaging circuit 108. Detailed structure and operation of the isolator 106 will be described below in conjunction with FIG. 5.

The averaging circuit 108 averages the output signal received from the current rectifier 104 and the isolator 106. The averaging circuit 108 may be any suitable combination of passive components. The averaging circuit 108 produces an output signal at output 114 having a signal value indicative of peak values of the differential input voltage at the input 112.

The first common mode feedback circuit 110 provides the feedback signal to the feedback input 118 of the OTA 102. Structure and operation of the first common mode feedback circuit 110 will be described below in conjunction with FIG. 6. The second common mode feedback circuit 113 provides a feedback signal to the amplifier 115. Structure and operation of the second common mode feedback circuit 113 will be described below in conjunction with FIG. 7. The amplifier 115 improves frequency response of the peak detector in a manner to be described in conjunction with FIGS. 4 and 5 below.

FIG. 2 is a circuit model of a portion of the peak detector circuit of FIG. 1. In FIG. 2, the OTA 102 is modelled as a current source 202, output resistance 204 and output capacitance 206. The current rectifier 104 (FIG. 1) is modelled as a load resistance 208. The load resistance 208 is coupled in parallel with the output resistance 204 and output capacitance 206.

The frequency of operation of the OTA 102 and thus the peak detector circuit 100 of FIG. 1 is limited by the output resistance 204 and output capacitance 206 at node 210. The output capacitance 206 includes both capacitance of the OTA 102 and capacitance of the load. The output resistance 204 and output capacitance 206 rob current at the output 116 of the OTA 102. The current through the output impedance of the OTA is not integrated at the output of the current rectifier 104. This affects the linearity of the peak detector circuit and causes an error in operation. Particularly at higher frequencies, output current is diverted through the output capacitance 206 to ground rather than through the load impedance. To maintain accurate operation, the maximum operating frequency of the peak detector circuit must be limited. In one instance, operation was limited to a maximum operating frequency of 12 MHz.

FIG. 3 is a circuit diagram of a current rectifier 104 for use in the peak detector circuit 100 of FIG. 1. The current rectifier 104 is illustrated together with amplifier 115. The current rectifier 104 includes two half wave rectifiers driven by opposite phases of the output current. The current rectifier 104 includes a first half wave rectifier 301, including an input transistor 302 and a second transistor 306, and a second half wave rectifier 303 including an input transistor 304 and a second transistor 308. The current rectifier 104 further includes a transistor 312 and a bias circuit including a transistor 320 and a transistor 322. The transistor 312 is a diode-connected transistor. The bias circuit establishes a bias current for operation of the current rectifier 104. The bias current may be very small. In one implementation, the bias current was 0.5 µA.

The combination of the two half wave rectifiers forms a full wave rectifier. Input currents are received at first input 126 and second input 128. Output currents from the two half wave rectifiers are summed at the output 130. The current rectifier 104 is thus configured to fully rectify the differential output current received from the output 116 of the OTA 102 (FIG. 1).

The amplifier 115 increases the gate to source voltage ($V_{GS}$) of input transistor 302 and input transistor 304. This, in turn, reduces the turn-on impedance. The amplifier 115 thus acts to reduce the total input impedance of the current rectifier 104, which corresponds to the load resistance 208 (FIG. 2) seen by the OTA 102. This reduces loading on the OTA 102 and permits operation at a higher operating frequency. An exemplary embodiment of the amplifier 115 will be described below in conjunction with FIG. 4.

The two half wave rectifiers each comprise a transistor configured to detect a phase of the output current and produce a current in response to the phase of the output current and a bias voltage applied to a gate. Thus, the first half wave rectifier 301 includes input transistor 302 which detects phase of the output current from the OTA 102 and produces a current at the output 130. Similarly, the second half wave rectifier 303 includes input transistor 304 which detects the other phase of the output current from the OTA 102 and produces a current at the output 130. The amplifier 115 applies the signal voltage in response to the phases of the output current.

FIG. 4 is a circuit diagram of an amplifier 115 for use in the current rectifier 104 of FIG. 3. Any suitable amplifier circuit having wide band frequency response and sufficient linear range with low parasitic capacitance may be used for the differential amplifier 115 in FIG. 3. Amplifier 115 of FIG. 4 is a differential amplifier and is exemplary only.

The differential amplifier 115 includes a transistor 402 coupled to the first input 126 and a transistor 404 coupled to the second input 128. The differential amplifier 115 further includes load elements in the form of resistor 410 and resistor 412 coupled between the drain of transistor 402 and the drain of transistor 404 and the positive power supply, respectively. The differential amplifier 115 still further includes bias elements in the form of bias transistor 406 and bias transistor 408. The bias elements establish bias currents in response to a common mode feedback signal applied to their gates from the second common mode feedback circuit 113. The bias currents are modulated in response to the signal received at the gate of transistor 402 and the gate of transistor 404. The bias currents conducted through the load elements produce a differential voltage drop at the outputs of the differential amplifier 115, output 330 and output 332.

FIG. 5 is a circuit diagram of an isolator 106 for use in the peak detector circuit of FIG. 1. The isolator 106 operates to electrically isolate the output 130 of the current rectifier 104 from loading due to the averaging circuit 108 (FIG. 1). In previous applications, an operational amplifier having unity voltage gain has been used for this purpose. However, operational amplifiers are relatively complicated circuits which require area on the surface of a semiconductor integrated circuit and which require operating current. It is desirable to minimize both of these design factors.

Other applications have attempted to use a current mirror which receives the output current from the current rectifier 104 and mirrors the output current to drive the averaging circuit. However, for accurate operation, the isolator needs to have high output impedance which necessitates transistors having relatively long gate lengths. The long gate lengths, however, increase the parasitic capacitance of the mirroring transistors, slowing down dynamic operation of the circuit. This situation is improved slightly by using a cascode transistor at the output of the isolator in series with the current mirror transistor, the cascode transistor being biased by a fixed DC potential. However, mirroring of the input current to the output current has still been inaccurate.

The isolator 106 of FIG. 5 solves these problems by providing a precision current mirror including an input configured to receive an input current and an output, a current mirror, a cascode transistor and a bias circuit providing a variable bias signal to the cascode transistor in response to the input current. Accordingly, the isolator includes a current mirror 509 including a first transistor 508 and a second transistor 510 and a cascode transistor 512. The first transistor 508 detects a current from the current rectifier 104, which is modelled in FIG. 5 as a switching circuit. The second transistor 510 is mirrored with the first transistor. That is, the gate and drain of the first transistor 508 are shorted and the gate of the first transistor 508 is common with the gate of the second transistor 510.

The cascode transistor 512 is coupled in series with the second transistor 510 for providing an output current to the output 526, which in the illustrated embodiment of FIG. 1 is coupled to the averaging circuit 108. The source of the cascode transistor 512 is coupled directly to the drain of the second transistor 510 and the drain of the cascode transistor 512 is coupled to the output. In this manner, the current mirrored in the second transistor 510 from the input is conveyed to the output 526 through the cascode transistor 512.

The bias circuit includes transistor 514, transistor 516 and transistor 518. Transistor 518 operates to mirror current in transistor 520, which has a current magnitude I determined in response to the current from the current rectifier. The current in transistor 518 may be reduced to a fraction, such as I/N, of the current in transistor 520. This variable current I/N is conducted by transistor 514 and transistor 516. Since the gate of the cascode transistor 512 is common with the gate of transistor 514, variation of the current I/N in transistor 514 varies the bias level of both transistor 514 and the cascode transistor 512 and thus the output impedance of the precision current mirror and isolator 106. The relative sizes of the transistors shown in FIG. 5 are tailored to provide accurate operation.

As noted, the current I/N has a current magnitude which varies relation to the input current from the current rectifier 104. FIG. 5 shows two alternative circuits which can accomplish this. In the first circuit, transistor 520 conducts the current I which is sourced in the switching circuit, current rectifier 104. The current I is a full wave rectified AC current. A bias transistor 522 maintains a bias current in transistor 520 and transistor 520 is diode connected, with its gate shorted to its drain.

Alternatively, as shown in dashed lines in FIG. 5, a third transistor 530 may be mirrored with the first transistor 508 to mirror the variable input current received by the current mirror 509 from the switching circuit. The mirrored current I is conveyed to transistor 532 which is configured as a current mirror with transistor 518. In this embodiment, transistor 520 has its gate coupled to a reference potential, rather than being diode-connected. Either circuit may be used to provide the variable current to the bias circuit, and other suitable alternatives may be used as well. The circuit illustrated in dashed lines provides the benefit of reduced sensitivity to power supply variation.

Figure 6:
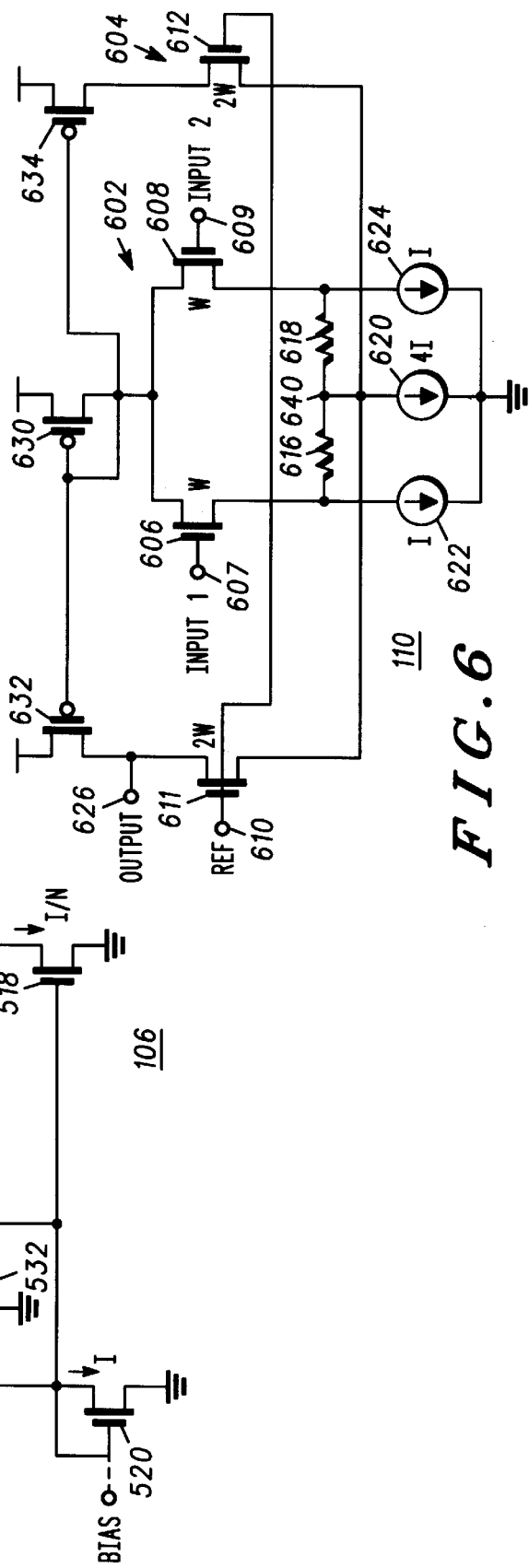
FIG. 6 is a circuit diagram of a common mode feedback circuit for use in the peak detector circuit of FIG. 1.

FIG. 6 is a circuit diagram of a common-mode feedback (CMFB) circuit 110 for use in the peak detector circuit 100 of FIG. 1 as the first common mode feedback circuit. The CMFB circuit 110 includes a pair 602 of differentially-coupled transistors which detect the OTA output signal. The OTA output signal, in the embodiment of FIG. 1, is the differential output current provided at the output 116 of the OTA 102. The pair 602 of differentially-coupled transistors includes transistor 606 and transistor 608. The OTA output signal is received at the input to the CMFB circuit, gate 607 and gate 609.

The CMFB circuit 110 further includes bias current sources, current source 622 and current source 624, coupled to the sources of the pair 602 of differentially-coupled transistors. The current sources establish bias currents for the pair 602 of differentially-coupled transistors. Further, the CMFB circuit 110 includes a third transistor 611. The third transistor 611 has a gate coupled at node 610 to a reference potential, labelled "REF" in FIG. 6. The drain of the third transistor 611 is coupled to the output 626 of the CMFB circuit 110, which is in turn coupled to the feedback input 118 of the OTA 102. In accordance with the present invention, the third transistor 611 has a source coupled to alternating current (AC) ground. The third transistor 611 compares the OTA output signal and a reference potential and produces an error signal in response.

The CMFB circuit 110 further includes a pair of resistors, including resistor 616 and resistor 618, coupled between the sources of the pair 602 of differentially-coupled transistors and an AC ground node, and a bias current source 620 coupled to the AC ground node and generating a substantially constant bias current. The resistors 616, 618 increase the linear range of the pair of differentially-coupled transistors. The resistors 616, 618 have the same value so that node 640 is at AC ground for both differential pairs of transistors. The source of the third transistor 611 is coupled to the AC ground node 640.

For symmetry, the CMFB circuit 110 also includes a fourth transistor 612 having a gate also coupled to the reference potential and a source also coupled to the AC ground node. The third transistor 611 and the fourth transistor 612 together form a second pair of differentially-coupled transistors which detect a reference signal. To complete identification of the elements in FIG. 6, the CMFB circuit 110 includes a load circuit coupled to the first pair 602 of differentially-coupled transistors and the second pair of differentially-coupled transistors 604 to produce an error signal in response to deviation of the OTA output signal from the reference signal. The load circuit includes a transistor 630 coupled to the drains of transistor 606 and transistor 608, a transistor 634 coupled to the drain of transistor 612, and a transistor 632 coupled to the drain of transistor 611, which is the output 626 of the CMFB circuit 110.

In operation, the signal received at gate 607 and gate 609 is the differential output signal from the OTA 102 in FIG. 1. These signals are AC voltage signals 180° out of phase, plus a DC voltage. The CMFB circuit 110 forces the DC voltage at the CMFB inputs to be the same as the reference potential labelled "REF" in FIG. 6. The load circuit including the current mirror formed by transistor 630, transistor 632 and transistor 634, forces the same current in each branch from the load circuit. Transistor 606 and transistor 608 are sized to have a width W and transistor 611 and transistor 612 are sized to have a width 2W. Current source 622 and current source 624 each supply current I while current source 620 supplies current 4I. These values cooperate to maintain the DC voltage at the input to the CMFB circuit substantially equal to the reference potential. An error signal is generated at the output 626 and provided to the feedback input 118 of the OTA 102.

For accurate operation, it is important that the pair 602 of differentially-coupled transistors operate as an amplifier, and not as a switch. That is, transistor 606 and transistor 608 must operate in their saturation regions of operation and not enter their linear or cut-off regions of operation. Addition of the resistor pair, resistor 616 and resistor 618, and tying the source of the third transistor 611 to the AC ground node 640, increases the range of linear operation for this circuit while keeping the gain of the circuit adequately high. Also, the CMFB circuit 110 includes multiple current paths to improve linearity. The current path through the third transistor 611 is independent of the current path through the pair 602 of differentially-coupled transistors. The improved linearity of the CMFB circuit 110 is provided even by using relatively low current drain. In one implementation, current drain for this circuit was limited to 90–100 $\mu$A while satisfying all other design requirements.

Figure 7:
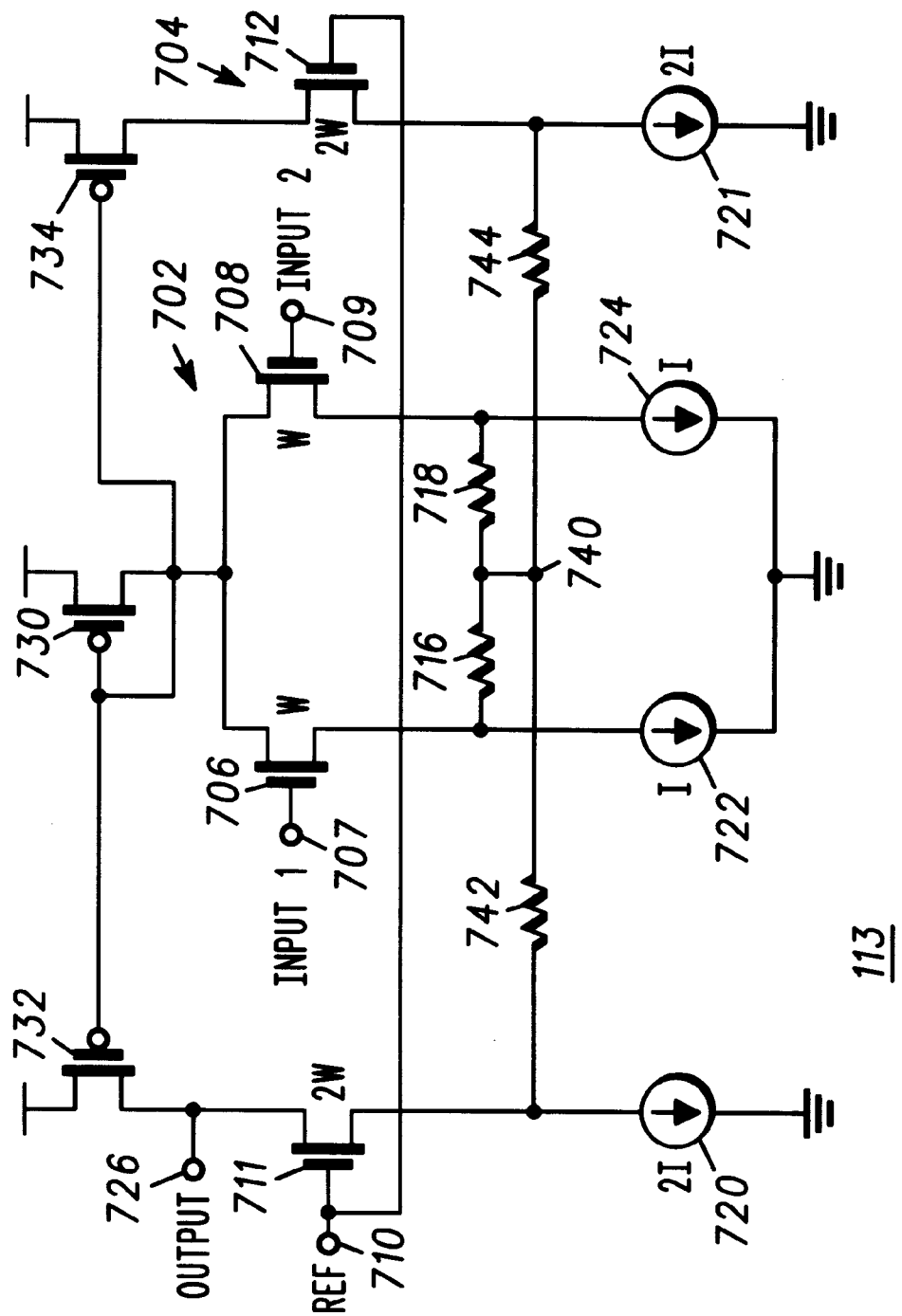
FIG. 7 is a circuit diagram of an alternative embodiment of a common mode feedback circuit for use in the peak detector circuit of FIG. 1.

FIG. 7 is a circuit diagram of a CMFB circuit 113 for use in the peak detector circuit 100 of FIG. 1 as the second common mode feedback circuit. The CMFB circuit 113 includes a pair 702 of differentially-coupled transistors which detect the OTA output signal. The pair 702 of differentially-coupled transistors includes transistor 706 and transistor 708. The output signal from the OTA is received at gate 707 and gate 709.

The CMFB circuit 113 further includes bias current sources, current source 722 and current source 724, coupled to the sources of the pair 702 of differentially-coupled transistors. The current sources establish bias currents for the pair 702 of differentially-coupled transistors. The CMFB circuit 113, also includes a pair of resistors, including resistor 716 and resistor 718, coupled between the sources of the pair 702 of differentially-coupled transistors. The resistors have the same value. The node 740 between the resistors is at AC ground.

Further, the CMFB circuit 113 includes a third transistor 711 which has a gate coupled to at node 710 a reference potential labelled "REF" in FIG. 7. The drain of the third transistor 711 is coupled to the output 726 of the CMFB circuit 113. The third transistor is matched with a fourth transistor 712 which also is coupled at its gate to the reference potential. Third transistor 711 and fourth transistor 712 form a second pair 704 of differentially-coupled transistors.

Still further, the CMFB circuit 113 includes a load circuit coupled to the first pair 702 of differentially-coupled transistors and the second pair of differentially-coupled transistors to produce an error signal in response to deviation of the OTA output signal from the reference signal. The load circuit includes a transistor 730 coupled to the drains of transistor 706 and transistor 708, a transistor 734 coupled to the drain of transistor 712, and a transistor 732 coupled to the drain of transistor 711, which is the output 726 of the CMFB circuit 113.

Distinct from the embodiment of FIG. 6, the CMFB circuit 113 of FIG. 7 includes a current source 720 supplying current to the source of third transistor 711 and a current source 720 supplying current to the source of fourth transistor 712. In addition, the CMFB circuit 113 of FIG. 7 includes an additional resistor pair including resistor 742 and resistor 744. Resistor 742 is coupled between the source of third transistor 711 and the AC ground at node 740. Resistor 744 is coupled between the source of fourth transistor 712 and the AC ground at node 740. Resistor 742 and resistor 744 are substantially identical in value.

The CMFB circuit 110 of FIG. 6 has a relatively high DC gain. With such a high DC gain, there is a risk that the circuit will oscillate rather than function properly. By adding the degeneration resistors, resistor 742 and resistor 744, the CMFB circuit 113 embodied in FIG. 7 reduces the risk of oscillation by reducing the DC gain of the circuit.

As can be seen from the foregoing, the present invention provides a peak detector circuit operable at input frequencies above 12 MHz. Due to the improvements explained herein, peak detection was achieved at 45 MHz with a 0.6 μm CMOS process for input voltages ranging from 50 mVpp differential to 450 mVpp with a power supply of 2.6 volts. The peak detector is constructed using a precision current mirror having a cascode transistor output in which the bias voltage is dynamically adjusted to achieve accurate mirroring and an amplifier in the common mode feedback circuit which has improved linear range.

While a particular embodiment of the present invention has been shown and described, modifications may be made. It is therefore intended in the appended claims to cover all such changes and modifications which fall within the true spirit and scope of the invention.

What is claimed is:

1. A peak detector circuit comprising:
    an operational transconductance amplifier (OTA) having an input for receiving a differential input voltage, the OTA producing an OTA output signal including a differential output current in response to the input voltage, the differential output current including two currents of substantially opposite phase;
    a current rectifier coupled to the OTA which produces a signal in response to the differential output current, the current rectifier including
        two half wave rectifiers each having two input transistors each driven by the two currents of substantially opposite phase of the differential output current, and
        a differential amplifier coupled to the two input transistors and configured to reduce gate to source voltage of the input transistors which decreases input impedance of the two half wave rectifiers to increase operating frequency of the peak detector circuit;
    an isolator coupled to the current rectifier; and
    an averaging circuit coupled to the isolator, the averaging circuit producing an output signal having a signal value indicative of peak values of the differential input voltage.

2. A peak detector circuit as recited in claim 1, wherein the differential output current is coupled both to the input transistors of the half wave rectifiers and to the differential amplifier, the differential amplifier applies a bias voltage to each gate of the input transistors in response to the phases of the differential output current, and each input transistor is configured to detect the phases of the differential output current and produce a current in response to both the phases of the differential output current and the bias voltage applied to the gate from the differential amplifier.

3. A peak detector circuit as recited in claim 1, further comprising a common-mode feedback circuit coupled between the current rectifier and the OTA, the common-mode feedback circuit operates to feedback a common-mode error signal to at least one of the OTA and the differential amplifier.

4. A peak detector circuit as recited in claim 3, wherein the common-mode feedback circuit comprises:
    a pair of transistors which detect the differential output current of the OTA output signal;
    bias current sources coupled to sources of the pair of transistors; and
    a third transistor having a gate coupled to a reference potential, a source coupled to an alternating current (AC) ground node, a drain coupled to an output node of the common mode feedback circuit and a load circuit; wherein the drains of the pair of transistors are coupled to the load circuit.

5. A peak detector circuit as recited in claim 4 wherein the common-mode feedback circuit further comprises:
    a pair of resistors coupled between sources of the pair of differentially-coupled transistors and the AC ground node; and
    a bias current source coupled to the AC ground node and generating a substantially constant bias current.

6. A peak detector circuit as recited in claim 3, wherein the common-mode feedback circuit comprises:
    a first pair of transistors which detect the differential output current of the OTA output signal;
    a pair of bias current sources coupled to sources of the first pair of transistors;
    a pair of resistors coupled between sources of the first pair of transistors and an alternating current (AC) ground node;
    a second pair of transistors which commonly detect a reference potential at gates thereof, the sources of the second pair of transistors being coupled to the AC ground node;
    a current source coupled to the AC ground node which generates a substantially constant bias current; and
    a load circuit coupled to the drains of the first pair of transistors and the drains of the second pair of transistors,
    wherein the drain of one of the second pair of transistors is coupled to an output node of the common-mode feedback circuit.

7. A peak detector circuit as recited in claim 1 wherein the isolator comprises a precision current mirror which provides an output current to the averaging circuit in response to a current from the current rectifier.

8. A peak detector circuit as recited in claim 1 wherein the isolator comprises:
- a current mirror including a first transistor which detects a current from the current rectifier and a second transistor mirrored with the first transistor;
- a cascode transistor coupled in series with the second transistor for providing an output current to the averaging circuit; and
- a bias circuit providing a variable bias signal to the cascode transistor in response to the current from the current rectifier.

9. A peak detector circuit as recited in claim 8 wherein the bias circuit provides a variable voltage to the cascode transistor to vary output impedance of the isolator.

10. A peak detector circuit as recited in claim 9 wherein the bias circuit includes a transistor having a gate coupled to a gate of the cascode transistor and a drain which conducts a variable current, the variable current varying in correspondence with the input current.

11. An amplifier comprising:
- a pair of transistors configured to detect a differential input signal;
- bias current sources coupled to sources of the pair of transistors;
- a pair of resistors coupled between sources of the pair of transistors and an AC ground node;
- a bias current source coupled to the AC ground node and generating a substantially constant bias current; and
- a third transistor having a gate coupled to a reference potential, a source coupled to the AC ground node, a drain coupled to an output node of the amplifier and a load circuit; wherein the drains of the pair of transistors are coupled to the load circuit.

* * * * *

UNITED STATES PATENT AND TRADEMARK OFFICE
CERTIFICATE OF CORRECTION

PATENT NO. : 5,969,545
DATED : October 19, 1999
INVENTOR(S) : Assadian

It is certified that error appears in the above-identified patent and that said Letters Patent is hereby corrected as shown below:

Title Page

Item [56] Attorney, Agent, or Firm
  Replace "Brian Mancini" with --John G. Rauch and Brian Mancini--.

Signed and Sealed this

Twenty-fifth Day of April, 2000

*Attest:*

Q. TODD DICKINSON

*Attesting Officer*      *Director of Patents and Trademarks*